US006506989B2

(12) United States Patent
Wang

(10) Patent No.: US 6,506,989 B2
(45) Date of Patent: Jan. 14, 2003

(54) MICRO POWER SWITCH

(75) Inventor: Wanjun Wang, Baton Rouge, LA (US)

(73) Assignee: Board of Supervisors of Louisana State University and Agricultural and Mechanical College, Baton Rouge, LA (US)

( * ) Notice: Subject to any disclaimer, the term of this patent is extended or adjusted under 35 U.S.C. 154(b) by 0 days.

(21) Appl. No.: 09/812,470

(22) Filed: Mar. 20, 2001

(65) Prior Publication Data

US 2002/0145493 A1 Oct. 10, 2002

(51) Int. Cl.[7] .......................... H01H 59/00; B81B 7/00
(52) U.S. Cl. .......................................... 200/181; 335/78
(58) Field of Search ................................ 200/181, 600; 333/101–108, 262; 73/514.01–514.38; 361/233; 257/414–420; 335/78, 207

(56) References Cited

U.S. PATENT DOCUMENTS

| | | | | | |
|---|---|---|---|---|---|
| 5,121,089 | A | * | 6/1992 | Larson | 200/181 X |
| 5,278,368 | A | | 1/1994 | Kasano et al. | 200/181 |
| 5,544,001 | A | | 8/1996 | Ichiya et al. | 361/233 |
| 5,638,946 | A | | 6/1997 | Zavracky | 200/181 |
| 6,133,807 | A | * | 10/2000 | Akiyama et al. | 200/181 X |
| 6,144,545 | A | * | 11/2000 | Lee et al. | 200/181 X |

OTHER PUBLICATIONS

Drake, J. et al., "An Electrostatically Acutated Micro–Relay," *The 8th International Conference on Solid–State Sensors and Actuators, and Eurosensors IX*, pp. 380–383 (1995).

Gretillat, M.A. et al., "Electrostatic polysilicon Microrelays Integrated With MOSFETs," *The Proceedings of Micro Electromechanical Systems Workshop* , pp. 97–101 (1994).

Petersen, K., "Silicon as a Mechanical Material" in Trimmer, W.S., *Micromechanics and MEMS* (New York, The Institute of Electrical and Electronic Engineering, Inc., 1990), pp. 58 and 88–90.

Yao, J.J. et al., "A Surface Micromachined Miniature Switch for Telecommunications Applications With Signal Frequencies From DC up to 4 GHZ," *The 8th International Conference on Solid–State Sensors and Actuators, and Eurosensors IX*, pp. 384–387 (1995).

* cited by examiner

*Primary Examiner*—J. R. Scott
(74) *Attorney, Agent, or Firm*—André J. Porter; Bonnie J. Davis; John H. Runnels

(57) ABSTRACT

A power switching device is disclosed that achieves a complete, mechanical "on" and "off" electrical circuit. The device is a rapid micro-relay that comprises two separate systems: a control driving signal system and a voltage delivery system. Its electrostatic actuator and switching connectors are electrically separated, inhibiting interference between the two systems. The micro-relay can optionally be adapted to support multiple voltage delivery systems for separate circuits.

16 Claims, 2 Drawing Sheets

MICRO POWER SWITCH

This invention pertains to switching devices or relays, particularly to very small switching devices, or relays.

Switching devices (relays) are widely used in many industries for various applications. Traditional mechanical relays are used for control purposes in various machines and processes. However, these devices are large, slow, and noisy. Another type of control device available in different forms is the solid-state switch. As compared to conventional mechanical relays, solid-state switches generally have longer life times, faster responses, and smaller sizes, making them ideal for use in micron and millimeter scale integrated circuits ("MMIC"). State-of-the-art technology uses compound solidstate switches, such as GaAs, MOSFETs, and PIN diodes. However, solid-state switches have relatively low off-resistance and relatively high on-resistance, resulting in high power consumption and poor electrical isolation (typically no better than about −30 dB). The trade-off for reducing on-resistance in these devices has been an increase in output capacitance, which causes problems in high frequency applications.

The principal technology for fabricating micromechanical elements has been silicon-based. Silicon microstructures, (e.g., cantilevers, membranes, and bridge structures) are produced in various microdevices and microsystems using photolithography and anisotropic etching. Micro-electromechanical relays used in micro-electromechanical systems ("MEMS") have opened new opportunities in various industries, such as telecommunications (micro-optical components), and biomedical and chemical applications.

As compared to solid-state switches, electromechanical micro-relays have the same advantages as traditional mechanical relays, such as lower on-resistance, higher off-resistance, higher dielectric strength, lower power consumption, and lower costs. However, MEMS technology has reduced the size and switching time of micromechanical relays as compared to traditional relays.

Several prototypes of micro-relays have been reported, most of which are electrostatically actuated. One reported prototype is an electrostatic polysilicon micro-relay integrated with MOSFETs. See M. A. Gretillat et al, "Electrostatic polysilicon Microrelays Integrated With MOSFETs," *The Proceedings of Micro Electromechanical Systems Workshop*, pp. 97–101 (1994).

J. Drake et al., "An Electrostatically Actuated Micro-Relay," *The 8$^{th}$ International Conference on Solid-State Sensors and Actuators, and Eurosensors* IX, pp. 380–383 (1995) discloses an electrostatically actuated micro-relay for use in automatic test equipment. The construction of this relay involved the separate fabrication of some components on a silicon chip and other components on a glass chip, the careful alignment of the two chips, and the bonding of the two chips by an undisclosed "proprietary metal sealing technique." The relay was reported to be capable of operating at an actuation voltage less than 100 V, an on-resistance less than 3 ohms, and a closure time less than 20 ms. A polysilicon paddle from the silicon side of the device responded to an electric potential applied between the glass side and the silicon side to deflect a conducting shunt until it closed a circuit between relay electrodes on the glass side.

K. Petersen, "Silicon as a Mechanical Material" in Trimmer, W. S., *Micromechanics and MEMS* (New York, The Institute of Electrical and Electronic 25 Engineering, Inc., 1990), pp. 58 and 88–90 discloses a micromechanical switch device for use in areas, such as telephone and analog signal switching arrays, charge-storage circuits, and temperature and magnetic field sensors. The device operates by providing a voltage between a deflection electrode, which acts as a cantilever beam, and a ground plane. As the cantilever beam is deflected a connection is created between the contact electrode and the fixed electrode. It has been reported that this switch can be produced by batch-fabrication in large arrays, that it exhibits high off-state to on-state impedance ratios, and that it requires a low switch power and low sustaining power. However, the device requires a relatively high switching voltage (near 50 V), and exhibits a relatively low current-carrying capability (perhaps less than 1 A).

Another reported micro-relay is a surface, micromachined miniature switch for telecommunications applications. "Surface switches" are switches microfabricated using a silicon fabrication method. The device was made on a semi-insulating GaAs substrate using a suspended, silicon dioxide micro-beam as a cantilever arm, a platinum-to-gold electrical contact, and an electrostatic actuation switching mechanism. The relay functions from DC to RF frequencies, with an electrical isolation of −50 dB, an insertion loss of 0.1 dB at 4 GHz, and a switch closure time of approximately 30 ms. See J. J. Yao et al., "A Surface Micromachined Miniature Switch for Telecommunications Applications With Signal Frequencies From DC up to 4 GHZ," *The 8$^{th}$ International Conference on Solid-State Sensors and Actuators, and Eurosensors* IX, pp. 384–387 (1995). The "microbridge" cantilever pivots in response to an electrostatically induced torque to close a circuit.

U.S. Pat. No. 5,638,946 describes a micro-mechanical switch having an isolated contact located on a beam. The isolated contact is separated from the main body of the beam by an insulated connector, which allows a circuit to be switched without altering or affecting any fields or currents used to actuate the switch. An electrostatically-induced torque causes the movable electrode to pivot and close a circuit.

U.S. Pat. No. 5,544,001 describes an electrostatic relay that comprises an actuator frame having a pivotally movable electrode and at least one fixed base. The base has a fixed electrode and a pair of fixed contacts insulated from the fixed electrode. An electrostatically-induced torque causes the movable electrode to pivot and close a circuit.

U.S. Pat. No. 5,278,368 describes an electrostatic relay that comprises a fixed electrode having a fixed insulated contact and a movable electrode plate having an insulated movable contact. The movable electrode plate is pivotally supported to move between two rest positions facilitating opening and closing of the contacts. An electrostatically-induced torque causes the movable electrode to pivot and close a circuit.

A preferred technology for microfabricating high power micro-relays and relay arrays is the LIGA process. ("LIGA" is a German acronym for "lithography, electrodeposition, and plastic molding"). LIGA provides flexibility in materials selection and the capability to make high aspect ratio microstructures. There are several advantages to using a LIGA process, as compared to other MEMS processes, including the following: (1) LIGA processes allow fabrication of microstructures of any lateral shape with structural heights up to 1000 mm or higher and lateral dimensions of 1 mm or smaller; (2) LIGA processes have submicron accuracy; (3) LIGA processes are capable of supporting nearly any cross-sectional shape; and (4) different materials can be used in LIGA processes, including polymers, metals, alloys, ceramics, and combinations thereof.

A UV-based LIGA process is usually preferred, if feasible, because an X-ray LIGA process requires expensive X-ray masks and beam lines. In the UV-LIGA process, a preferred resist is EPON® resin SU-8 (marketed, for example, by Micro Chemicals, Inc.). The UV approach helps to reduce the cost of fabrication significantly, while increasing productivity. For example, an x-ray exposure usually takes several hours, while an exposure with UV can be performed within seconds. Additionally, x-ray masks typically cost between $8,000 and $10,000, while the UV-LIGA process uses optical masks, which typically cost about $100–$200.

An unfilled need exists for a micro power, solid-state switching device with characteristics including: low-on resistance, high off-resistance, high reliability, high power capacity, fast response, small-size, and suitability for low cost batch-production.

I have discovered a power switching device that achieves a complete, mechanical "on" and "off." The device is a rapid micro-relay capable of transmitting large or small currents for use in various industrial applications, such as automation and control of machines and processes. The device comprises two separate systems: a control driving signal system and a voltage delivery system, making it capable of handling both high and low voltages. Its electrostatic actuator and switching connectors are electrically separated. The device resists corrosion, while providing complete insulation between the control driving signal system and the voltage delivery system. The micro-relay can optionally be adapted to support multiple voltage delivery systems for separate circuits.

The novel device is based on deflection of a spring or springs in response to an electrostatic field to close a circuit, whereas most prior devices have relied on torsion of a cantilever. Flat springs are preferred for a symmetric dynamical response. The novel relay may be fabricated on a single substrate using, for example, LIGA techniques, and requires minimum bonding and alignment. Typical preferred dimensions for the relay range from a few hundred micrometers to several millimeters.

This invention provides a reliable, inexpensive microswitch for delivering low or high power. The basic design comprises a control signal system and a voltage delivery system. In a preferred embodiment, all the components of the device comprise metal or alloys, except the insulators and the substrate. The metallic components should be capable of being readily electroplated or deposited, and should have relatively high mechanical strength and electrical conductivity, such as nickel, a nickel alloy or copper. The insulators are preferably formed of a polymer capable of resisting damage caused by temperatures as high as 120° C. (the glass transition temperature of cured SU-8), while providing essentially complete electrical insulation, such as SU-8 and polymethyl methacrylate ("PMMA"). The substrate comprises an electrically nonconductive material, such as glass or silica.

There are several advantages to microfabricating this device using a LIGA process. First, the number of components can be minimal. Fabrication can be simple and inexpensive. Second, the novel design is three-dimensional, unlike most prior micro-relays which are essentially two-dimensional in design. A three-dimensional design can better support a high current by allowing the wire size of the relay electrodes to increase as needed, while two-dimensional designs use relatively thin metal films to conduct current. Finally, the design of the relay makes it possible to fabricate high-aspect-ratio metal electrodes to be used as switching contacts and connections for several channels concurrently. Micro-relays in accordance with the present invention can be very reliable, have low on-resistance, high off-resistance, and high power capacity.

EXAMPLE 1

An Electrostatically Actuated, Vertical Design Micro-relay

Figure 1:
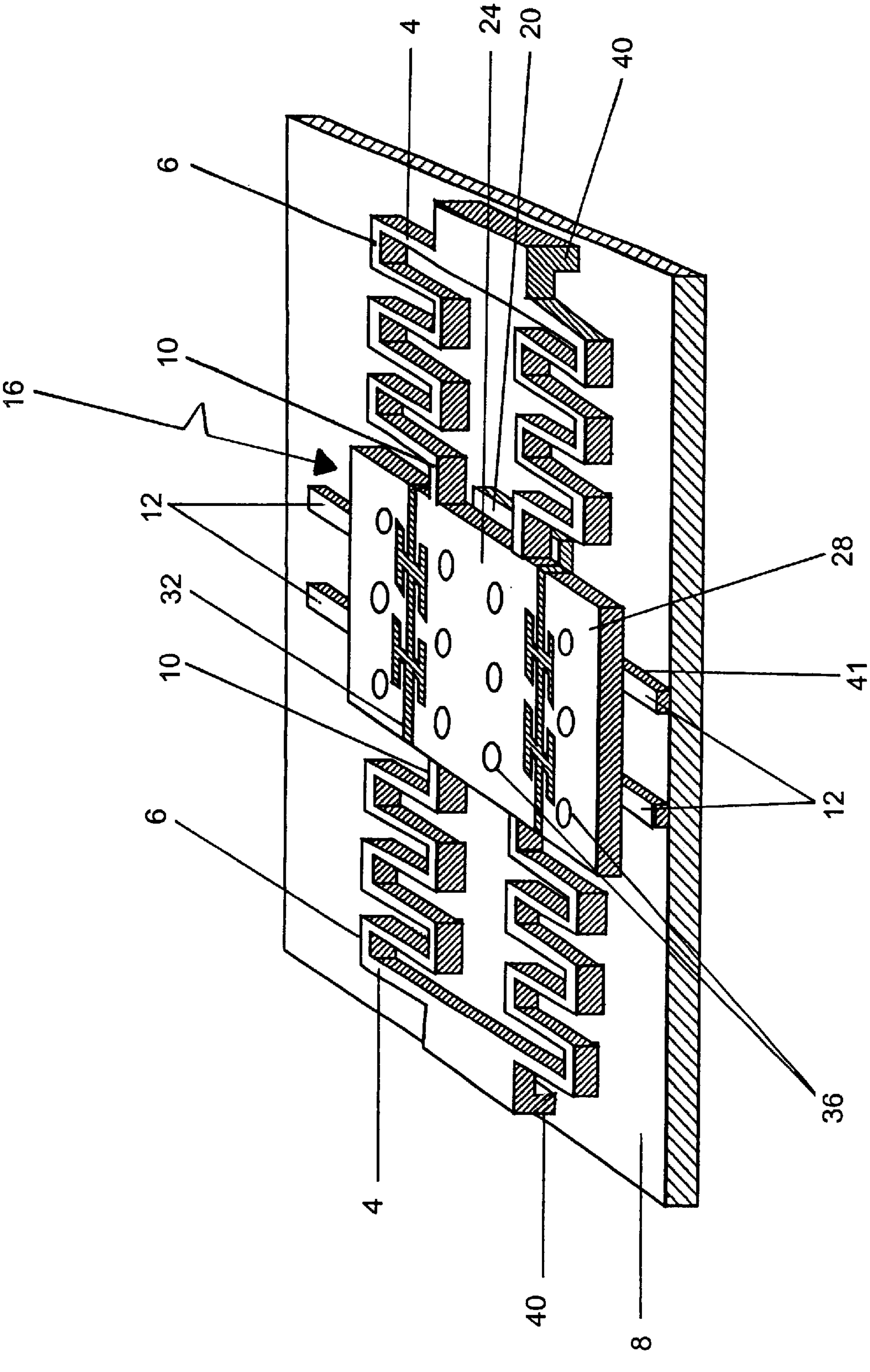
FIG. 1 illustrates a perspective view of one embodiment of a vertical design, electrostatically actuated, dual-switch micro-relay.

FIG. 1 illustrates one embodiment of a dual-switch, "normally off" micro-relay with flat-springs. This embodiment comprises a substrate 8, two voltage delivery systems, and a control driving signal system having an armature 16, a bottom plate 20 of a parallel-plate capacitor, and two pairs of flat-springs 4, each having a proximal end 10 and distal end 6. The armature 16 comprises a top plate 24 of the parallel-plate capacitor, two electrode connectors 28, and two polymer insulators 32. The armature 16 functions both as an electrostatic actuator and as a switching mechanism. Alternatively, the flat-springs 4 could be replaced by suspension springs or other flexible suspension means.

While the parts of the armature 16 are physically connected, they are electrically separated. For example, a driving signal received by the top plate 24 will not transfer to the electrode connectors 28 because of the polymer insulators 32. The polymer insulators 32 are sized and shaped to be embedded into the two electrode connectors 28 and the top plate 24 to form a secure mechanical attachment while electrically isolating the top plate 24 from the two electrode connectors 28. The armature 16 is adapted to handle the voltage load applied to the voltage delivery system. In a preferred embodiment, the armature 16 includes holes 36, which both help the stripping process during microfabrication, and to reduce back pressure during relay operations.

As shown in FIG. 1, the voltage delivery system comprises two sets of switching contacts (power circuit electrodes) 12, one acting as input and one as output, both fixed to supporting pads 41 underneath each electrode connector 28. The length and width of each, power circuit electrode 12 is sufficient to allow isolated contact between the electrode connectors 28 and the power circuit electrodes 12 when the armature 16 moves downward, while handling the voltage load. Optionally, a thin film of gold may be deposited onto the electrode surfaces to lower the contact resistance between the power circuit electrodes 12 and the electrode connectors 28, and to reduce spark-induced corrosion.

As shown in FIG. 1, the armature 16 is suspended above the center of the substrate 8 by two pairs of flat-springs 4, which are both electrically and mechanically connected to top plate 24. The flat-springs 4 are symmetrically arranged to maintain dynamic balance, while allowing movement up and down (i.e., away from and towards substrate 8). The proximal end 10 of each flat-spring 4 is attached to the top plate 24, while the distal end 6 is fixed to one of the supporting pads 40 mounted at distal ends of the substrate 8. The supporting pads 40 are used to suspend the flat-springs 4 and thereby the armature,16. Note that, as shown most clearly on the right side of FIG. 1, the flat springs 4 are thinner than supporting pads 40, allowing the flat springs 4 to be suspended above substrate 8. Additionally, the top portions of supporting pads 40 act as electrodes to which a control driving signal for the parallel-plate capacitor is supplied. The flat-springs 4 are free to move together with the armature 16 because complete separation from the substrate 8 is maintained from the distal end 6 to the proximal end 10 of the flat-springs 4. The size and shape of the flat-springs 4 may be adapted to accommodate specific design requirements, such as total power capacity, response speed, and control voltage. Additionally, the flat-springs 4 must be strong enough to suspend the armature 16 prior to electrostatic actuation, yet be sufficiently flexible to allow the electrode connectors 28 to make contact with the power circuit electrodes 12 when a control driving signal is supplied.

The bottom plate 20 of the parallel-plate capacitor is fixed to supporting pads (not shown) directly underneath the top plate 24 of the parallel-plate capacitor. The bottom plate 20 is sized sufficiently to pull the top plate 24 near it when a driving voltage is supplied, while maintaining complete isolation from the other parts of the armature 16, flat-springs 4, and power circuit electrodes 12.

A prototype of this embodiment is currently being fabricated and will be tested. Nickel and copper are being used as the principal metallic components in the prototype. Cured SU-8 or PMMA is being used for polymer components, including the polymer connectors and the electrical insulators, and a silicon wafer is being used to fabricate the substrate. The prototype has a dimension of 3 mm×3 mm×0.7 mm, with a targeted current capacity of 2–3 A. The spring dimensions range from a few hundreds of micrometers to a few millimeters. The driving voltage ranges from 5 to 20 volts. The distance between the top and bottom plates of the capacitor are in the range of 5 to 50 mm.

A typical operation sequence for this "normally off" relay is as follows: (1) If there is a zero control signal, the two pairs of flat-springs 4 will remain in a neutral position (i.e., power circuit electrodes 12 do not make contact with the electrode connectors 28), and the relay will be in an "off" position. (2) If a control signal is supplied to (i.e., voltage difference applied between) the top plate 24 and bottom plate 20, electrostatic force will drive the armature 16 down until the two electrode connectors 28 make contact with the power circuit electrodes 12, thus switching the relay to an "on" position. (3) When the control signal is turned off, the two sets of flat-springs 4 will pull the armature 16 back to a neutral, balanced position, breaking contact between the two electrode connectors 28 and the power circuit electrodes 12.

In the prototype design as shown in FIG. 1, one control signal will be used to switch two channels (two sets of power circuit electrodes 12) "on" and "off." Alternatively, the design could readily be modified to accommodate one, three, or more channels as desired.

EXAMPLE 2

An Electrostatically Actuated, Horizontal Design Micro-relay

Figure 2:
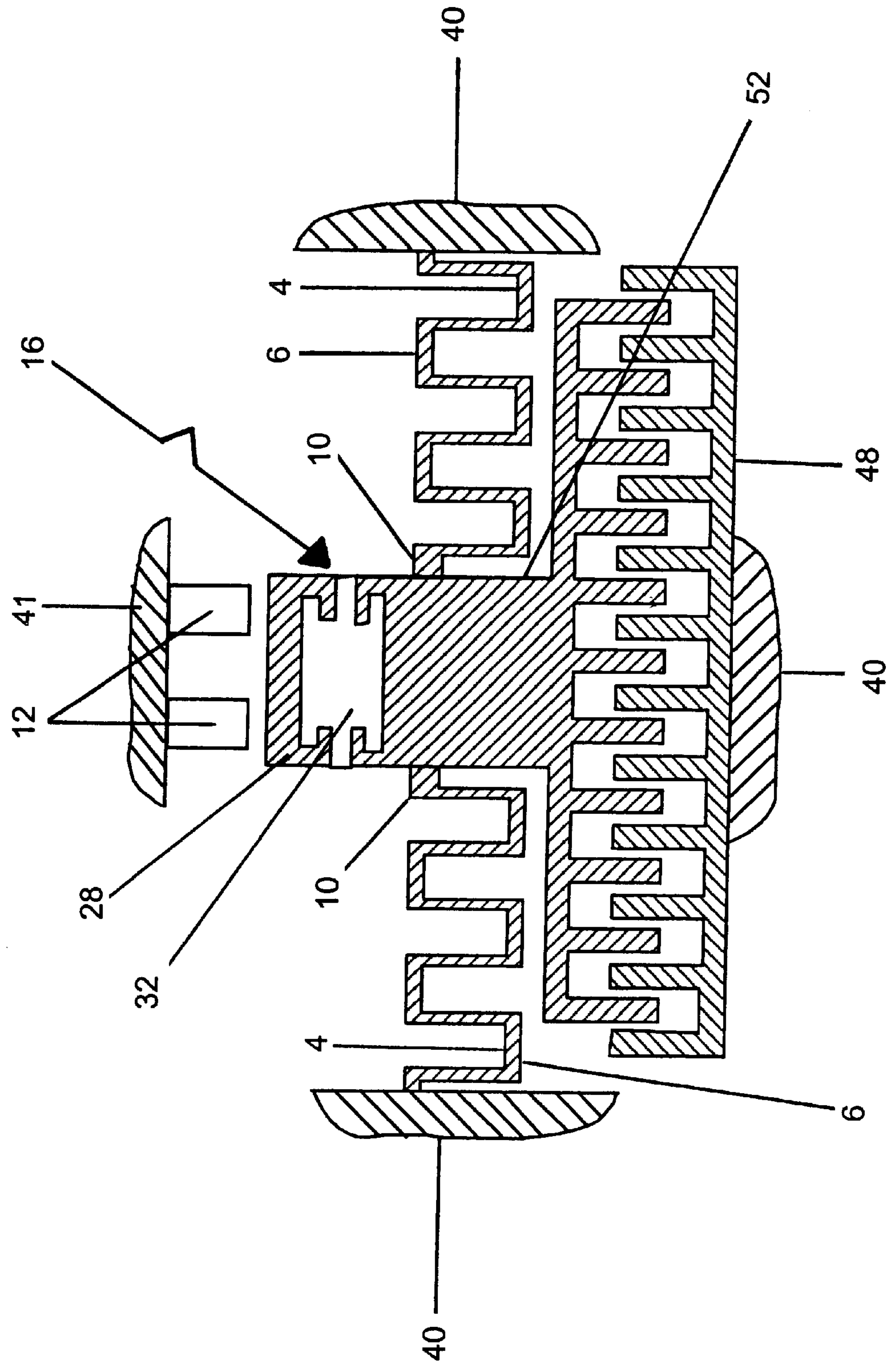
FIG. 2 illustrates a top plan view of one embodiment of a horizontal design micro-relay.

FIG. 2 illustrates one embodiment of a horizontal design single-switch micro-relay with flat-springs 4. This embodiment comprises a voltage delivery system, and a control driving signal system having an armature 16, a comb-shaped first plate 48 of a parallel-plate capacitor, and two flat-springs 4, each having a proximal end 10 and distal end 6. The armature 16 further comprises a polymer insulator 32, a comb-shaped second plate 52 of the parallel-plate capacitor, and one electrode connector 28. The second plate 52 is mechanically attached to the electrode connector 28 by embedding polymer into both the second plate 52 and the electrode connector 28, as in the embodiment; of FIG. 1. While the second plate 52 and the electrode connector 28 are physically attached, they remain electrically isolated from each other. The armature 16 is suspended by the flat-springs 4. The proximal end 10 of each flat-spring 4 is attached to the second plate 52, while the distal ends 6 are fixed to supporting pads 40. The voltage delivery system, comprising input and output power circuit electrodes 12, is attached to supporting pads 41 near electrode connector 28. Optionally, as mentioned in Example 1, a thin film of gold may be deposited on the surfaces of the electrodes to lower the contact resistance between the power circuit electrodes 12 and the electrode connector 28, and to reduce spark corrosion.

As shown in FIG. 2, comb-shaped first plate 48 of the parallel-plate capacitor is fixed to the supporting pad 40. The second plate 52, first plate 48, and flat-springs 4 are sized and shaped to facilitate opening and closing of the power circuit. In its neutral position, the electrode connector 28 is positioned away from the power circuit electrodes 12, forming an open circuit. However, when a driving signal is supplied to the first plate 48 and the second plate 52 (i.e., electrostatic charges of the same polarity) electrostatic force drives the second plate 52 away from the first plate 48, closing the power circuit. Tests will be conducted once fabrication of the prototype of this embodiment is completed. Nickel and copper are being used as the principal metallic components in the prototype. Cured SU-8 or PMMA is being used for polymer components, including the polymer connectors and the electrical insulators, and a silicon wafer is being used to fabricate the substrate. The prototype has a dimension of 3 mm×3 mm×0.7 mm, with a targeted current capacity of 2–3 A. Experimental and theoretical studies will be conducted to optimize specifications for the prototype.

Various devices can be adapted from these basic designs to control a wide range of applications (e.g., horizontal dual-switching relays, vertical single-switching relays, three-way relays, low voltage relays, high voltage relays, etc.), by simply changing the layout or size of the springs, adding more electrodes, changing the geometry of the switching contacts, switching connectors and parallel-plate capacitors, or supplying different control signals to generate actuation of the armature in different directions and levels. Depending on the particular configuration, either an attractive force or a repulsive force may be used to close the electrical circuit.

The complete disclosures of all references cited in this specification are hereby incorporated by reference. In the event of an otherwise irreconcilable conflict, however, the present specification shall control.

I claim:

1. A micromechanical relay comprising:

(a) a substrate;.

(b) one or more springs, wherein said spring or springs are mechanically attached to said substrate in at least two separate locations;

(c) an armature mechanically attached to said spring or springs, and suspended from said spring or springs at a position intermediate the locations of attachment of said substrate to said spring or springs; wherein said armature comprises:

(i) a first electrically conductive plate;

(ii) one or more electrically conductive connectors; and (iii) an insulator or insulators that mechanically connect said connector or connectors to said first electrically conductive plate, while keeping said connector or connectors electrically isolated from said first electrically conductive plate;

(d) a pair of electrically conductive switching contacts associated with each said connector, wherein said switching contacts are mechanically attached to said substrate, and wherein said switching contacts are electrically isolated from one another until contacted by the associated connector; and (e) a second electrically conductive plate mechanically attached to said substrate, adjacent to but electrically isolated from said first electrically conductive plate; wherein:

(f) if an electrical potential of an appropriate magnitude is applied between said first and second electrically conductive plates, the electrical potential generates an electrostatic force between said first and second electrically conductive plates that drives said armature towards at least one pair of said switching contacts, overcoming the tension of said spring or springs sufficiently to cause at least one of said connectors to make electrical contact with said associated pair of switching contacts, thereby closing an electrical connection between said associated pair of switching contacts.

2. A relay as recited in claim 1, wherein at least one of said springs is electrically conductive; and wherein said first electrically conductive plate is electrically connected to at least one said electrically conductive spring; whereby an electric potential between said first and second electrically conductive plates may be applied by imposing an electric potential between at least one said electrically conductive spring and said second electrically conductive plate.

3. A relay as recited in claim 1, wherein each of said springs is a flat spring.

4. A relay as recited in claim 1, wherein each of said springs is a suspension spring.

5. A relay as recited in claim 1, wherein said armature is movable in a direction substantially perpendicular to said substrate.

6. A relay as recited in claim 5, wherein said first and second electrically conductive plates are substantially flat and are substantially parallel to one another.

7. A relay as recited in claim 1, wherein said armature is movable in a direction substantially parallel to said substrate.

8. A relay as recited in claim 7, wherein said first and second electrically conductive plates are comb-shaped plates that interdigitate without touching one another.

9. A micromechanical relay comprising:

(a) a substrate;

(b) one or more springs, wherein said spring or springs are mechanically attached to said substrate;

(c) an armature mechanically attached to said spring or springs, and suspended from said spring or springs at a position intermediate the locations of attachment of said substrate to said spring or springs; wherein said armature comprises:

(i) a first electrically conductive plate;

(ii) one or more electrically conductive connectors; and (iii) an insulator or insulators that mechanically connect said connector or connectors to said first electrically conductive plate, while keeping said connector or connectors electrically isolated from said first electrically conductive plate;

(d) a pair of electrically conductive switching contacts associated with each said connector, wherein said switching contacts are mechanically attached to said substrate, and wherein said switching contacts are electrically isolated from one another until contacted by the associated connector; and (e) a second electrically conductive plate mechanically attached to said substrate, adjacent to but electrically isolated from said first electrically conductive plate; wherein:

(f) if an electrical potential of an appropriate magnitude is applied between said first and second electrically conductive plates, the electrical potential generates an electrostatic force between said first and second electrically conductive plates that drives said armature towards at least one pair of said switching contacts, overcoming the tension of said spring or springs sufficiently to cause at least one of said connectors to make electrical contact with said associated pair of switching contacts, thereby closing an electrical connection between said associated pair of switching contacts.

10. A relay as recited in claim 9, wherein at least one of said springs is electrically conductive; and wherein said first electrically conductive plate is electrically connected to at least one said electrically conductive spring; whereby an electric potential between said first and second electrically conductive plates may be applied by imposing an electric potential between at least one said electrically conductive spring and said second electrically conductive plate.

11. A relay as recited in claim 9, wherein each of said springs is a flat spring.

12. A relay as recited in claim 9, wherein each of said springs is a suspension spring.

13. A relay as recited in claim 9, wherein said armature is movable in a direction substantially perpendicular to said substrate.

14. A relay as recited in claim 13, wherein said first and second electrically conductive plates are substantially flat and are substantially parallel to one another.

15. A relay as recited in claim 9, wherein said armature is movable in a direction substantially parallel to said substrate.

16. A relay as recited in claim 15, wherein said first and second electrically conductive plates are comb-shaped plates that interdigitate without touching one another.

* * * * *